(12) United States Patent
Zhang

(10) Patent No.: US 9,601,630 B2
(45) Date of Patent: *Mar. 21, 2017

(54) TRANSISTORS INCORPORATING METAL QUANTUM DOTS INTO DOPED SOURCE AND DRAIN REGIONS

(71) Applicant: STMicroelectronics, Inc., Coppell, TX (US)

(72) Inventor: John H. Zhang, Fishkill, NY (US)

(73) Assignee: STMicroelectronics, Inc., Coppell, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/931,096

(22) Filed: Jun. 28, 2013

(65) Prior Publication Data

US 2014/0084245 A1 Mar. 27, 2014

Related U.S. Application Data

(60) Provisional application No. 61/705,608, filed on Sep. 25, 2012.

(51) Int. Cl.
*H01L 29/775* (2006.01)
*H01L 29/786* (2006.01)
(Continued)

(52) U.S. Cl.
CPC ............ *H01L 29/78618* (2013.01); *H01L 21/823814* (2013.01); *H01L 21/823828* (2013.01); *H01L 21/823842* (2013.01); *H01L 27/092* (2013.01); *H01L 29/0653* (2013.01); *H01L 29/127* (2013.01); *H01L 29/401* (2013.01); *H01L 29/413* (2013.01); *H01L 29/41766* (2013.01); *H01L 29/42392* (2013.01); *H01L 29/66431* (2013.01); *H01L 29/66621* (2013.01); *H01L 29/66636* (2013.01); *H01L 29/66666* (2013.01); *H01L 29/775* (2013.01); *H01L 29/7781* (2013.01); *H01L 29/78696* (2013.01); *H01L 29/165* (2013.01); *H01L 29/4236* (2013.01); *H01L 29/456* (2013.01); *H01L 29/4975* (2013.01)

(58) Field of Classification Search
CPC ................. H01L 29/775; H01L 29/66666
USPC ............................................. 257/20; 438/270
See application file for complete search history.

(56) References Cited

U.S. PATENT DOCUMENTS 4,485,550 A * 12/1984 Koeneke et al. ............ 438/233
5,346,851 A * 9/1994 Randall ................ B82Y 10/00
148/DIG. 169

(Continued)

OTHER PUBLICATIONS

Zhang et al., "Quantum size effect studies of isotopic and electronic properties of silver bromide ionic clusters," 2012, 26 pages.

(Continued)

*Primary Examiner* — Victoria K Hall
(74) *Attorney, Agent, or Firm* — Seed IP Law Group LLP

(57) ABSTRACT

Metal quantum dots are incorporated into doped source and drain regions of a MOSFET array to assist in controlling transistor performance by altering the energy gap of the semiconductor crystal. In a first example, the quantum dots are incorporated into ion-doped source and drain regions. In a second example, the quantum dots are incorporated into epitaxially doped source and drain regions.

20 Claims, 9 Drawing Sheets

(51) Int. Cl.
*H01L 29/66* (2006.01)
*H01L 29/40* (2006.01)
*H01L 29/417* (2006.01)
*H01L 29/778* (2006.01)
*H01L 29/41* (2006.01)
*H01L 21/8238* (2006.01)
*H01L 27/092* (2006.01)
*H01L 29/06* (2006.01)
*H01L 29/12* (2006.01)
*H01L 29/423* (2006.01)
*H01L 29/45* (2006.01)
*H01L 29/49* (2006.01)
*H01L 29/165* (2006.01)

(56) References Cited

U.S. PATENT DOCUMENTS

| | | | | |
|---|---|---|---|---|
| 5,923,046 A * | 7/1999 | Tezuka | | B82Y 10/00 257/14 |
| 5,960,319 A * | 9/1999 | Iwata et al. | | 438/664 |
| 6,005,271 A | 12/1999 | Hshieh | | |
| 6,042,345 A | 3/2000 | Bishop et al. | | |
| 6,207,482 B1 * | 3/2001 | Shih et al. | | 438/199 |
| 6,268,273 B1 * | 7/2001 | Kim | | B82Y 10/00 257/E21.404 |
| 6,482,714 B1 * | 11/2002 | Hieda et al. | | 438/416 |
| 6,518,625 B1 * | 2/2003 | Nishida | | H01L 21/2652 257/344 |
| 6,559,468 B1 * | 5/2003 | Kuekes | | B82Y 10/00 257/14 |
| 6,737,323 B2 * | 5/2004 | Mo | | H01L 21/28061 257/E21.2 |
| 6,780,742 B1 * | 8/2004 | Wasshuber | | 438/592 |
| 7,019,333 B1 * | 3/2006 | Shields | | B82Y 10/00 257/13 |
| 7,172,980 B2 | 2/2007 | Torres et al. | | |
| 7,180,087 B1 * | 2/2007 | Loss | | B82Y 10/00 257/9 |
| 7,582,490 B2 | 9/2009 | Golovchenko et al. | | |
| 8,294,137 B2 * | 10/2012 | Jain | | B82Y 10/00 257/20 |
| 8,598,006 B2 | 12/2013 | de Souza et al. | | |
| 8,680,577 B2 | 3/2014 | Zhang et al. | | |
| 8,859,350 B2 | 10/2014 | Zhang et al. | | |
| 8,981,344 B2 * | 3/2015 | Jain | | B82Y 10/00 257/20 |
| 2001/0032999 A1 | 10/2001 | Yoshida | | |
| 2002/0043895 A1 | 4/2002 | Richards et al. | | |
| 2002/0123183 A1 * | 9/2002 | Fitzgerald | | 438/199 |
| 2002/0134996 A1 * | 9/2002 | Morie | | B82Y 10/00 257/206 |
| 2002/0196827 A1 * | 12/2002 | Shields | | B82Y 20/00 372/45.01 |
| 2003/0122179 A1 * | 7/2003 | Matsuki | | H01L 21/28061 257/314 |
| 2003/0127608 A1 * | 7/2003 | Shields | | B82Y 10/00 250/493.1 |
| 2004/0155253 A1 * | 8/2004 | Chae | | B82Y 10/00 257/90 |
| 2005/0074340 A1 | 4/2005 | Xu et al. | | |
| 2005/0153530 A1 | 7/2005 | Ku et al. | | |
| 2005/0263795 A1 * | 12/2005 | Choi | | H01L 29/66795 257/213 |
| 2006/0081930 A1 * | 4/2006 | Maegawa et al. | | 257/347 |
| 2006/0163670 A1 * | 7/2006 | Ellis-Monaghan | | H01L 21/82381 257/388 |
| 2007/0007571 A1 * | 1/2007 | Lindsay | | H01L 21/26586 257/306 |
| 2007/0166972 A1 | 7/2007 | Park | | |
| 2007/0176227 A1 | 8/2007 | Liu et al. | | |
| 2007/0187776 A1 * | 8/2007 | Sasaki | | 257/379 |
| 2007/0189702 A1 | 8/2007 | Arndt et al. | | |
| 2007/0210299 A1 * | 9/2007 | Hirose | | H01L 31/0232 257/10 |
| 2007/0215860 A1 * | 9/2007 | Komiyama | | B82Y 10/00 257/21 |
| 2007/0252131 A1 * | 11/2007 | Tong | | H01L 21/76892 257/9 |
| 2007/0298558 A1 * | 12/2007 | Yamauchi | | H01L 21/26513 438/197 |
| 2008/0035962 A1 * | 2/2008 | Kim | | H01L 29/4236 257/288 |
| 2008/0076216 A1 * | 3/2008 | Pae | | H01L 21/28088 438/257 |
| 2008/0079074 A1 | 4/2008 | Icel et al. | | |
| 2008/0124920 A1 * | 5/2008 | Fitz | | H01L 21/28061 438/653 |
| 2008/0142838 A1 * | 6/2008 | Ohta et al. | | 257/190 |
| 2008/0169753 A1 * | 7/2008 | Skipor | | B41M 3/006 313/504 |
| 2008/0309234 A1 * | 12/2008 | Cho | | H05B 33/22 313/509 |
| 2009/0054752 A1 * | 2/2009 | Jonnalagadda | | A61B 5/721 600/324 |
| 2009/0173934 A1 * | 7/2009 | Jain | | G11C 11/56 257/20 |
| 2009/0194788 A1 | 8/2009 | Liu et al. | | |
| 2009/0309229 A1 * | 12/2009 | Angus | | B82Y 10/00 257/773 |
| 2010/0074293 A1 * | 3/2010 | Lochmann | | B82Y 20/00 372/45.012 |
| 2010/0108984 A1 * | 5/2010 | Cho | | C09K 11/025 257/13 |
| 2010/0155703 A1 * | 6/2010 | Jun | | B82Y 10/00 257/24 |
| 2010/0163843 A1 * | 7/2010 | Choi | | B82Y 10/00 257/24 |
| 2010/0213553 A1 | 8/2010 | Hargrove et al. | | |
| 2010/0224861 A1 * | 9/2010 | Jain | | B82Y 10/00 257/20 |
| 2010/0224938 A1 * | 9/2010 | Zhu | | 257/369 |
| 2010/0308374 A1 * | 12/2010 | Liu | | H01L 21/26506 257/192 |
| 2011/0079767 A1 * | 4/2011 | Senes | | B82Y 10/00 257/13 |
| 2011/0163327 A1 | 7/2011 | Ueno et al. | | |
| 2011/0176564 A1 * | 7/2011 | Hogg | | B82Y 20/00 372/26 |
| 2011/0193145 A1 * | 8/2011 | Ikarashi | | H01L 21/28518 257/288 |
| 2011/0309330 A1 * | 12/2011 | Ohnesorge | | B82Y 10/00 257/20 |
| 2012/0080793 A1 * | 4/2012 | Danek | | H01L 21/28562 257/751 |
| 2012/0091448 A1 | 4/2012 | Ueno et al. | | |
| 2012/0132966 A1 * | 5/2012 | Doris | | B81C 1/00095 257/288 |
| 2012/0181503 A1 * | 7/2012 | Lee | | H01L 29/78642 257/13 |
| 2012/0229167 A1 * | 9/2012 | Jain | | B82Y 10/00 326/122 |
| 2012/0280208 A1 * | 11/2012 | Jain | | B82Y 10/00 257/20 |
| 2012/0285532 A1 | 11/2012 | Yun et al. | | |
| 2012/0313144 A1 | 12/2012 | Zhang et al. | | |
| 2014/0015038 A1 * | 1/2014 | Ng | | H01L 29/10 257/330 |
| 2014/0084247 A1 * | 3/2014 | Zhang | | H01L 29/775 257/24 |
| 2015/0053930 A1 | 2/2015 | Zhang | | |
| 2016/0111521 A1 | 4/2016 | Zhang | | |

OTHER PUBLICATIONS

Zhang et al., "Theoretical Study of the Molecular and Electronic Structures of Neutral Silver Bromide Clusters $(AgBr)_n$, n=1-9," *J. Phys. Chem. A* 104:6287-6294, 2000.

(56) References Cited

OTHER PUBLICATIONS

Correa, N. Mariano et al., "Preparation of AgBr Quantum Dots via Electroporation of Vesicles", Journal of the American Chemical Society, Jun. 23, 2000, vol. 122, pp. 6432-6434.

Zhang, Hongguang et al. "Theoretical Study of the Molecular and Electronic Structures of Neutral Silver Bromide Clusters (AgBr) n, n=1-9", Journal of Physical Chemistry A, Jun. 10, 2000, vol. 104, pp. 6287-6294.

Foster, J. P. et al., "Natural Hybrid Orbitals," J. Am. Chem. Soc., vol. 102, pp. 7211-7218, 1980.

Reed, A. E. et al., "Intermolecular Interactions from a Natural Bond Orbital, Donor-Acceptor Viewpoint," Chem. Rev., vol. 88, pp. 899-926, 1988.

Mulliken, R. S., "Electronic Population Analysis on LCAO-MO Molecular Wave Functions. I," The Journal of Chemical Physics 23(10):1833-1840, Oct. 1955.

Wallmeier, H. et al., "Nature of the Semipolar XO Bond. Comparative Ab Initio Study of $H_3NO$, $H_2NOH$, $H_3PO$, $H_2POH$, $H_2P(O)F$, $H_2SO$, HSOH, HClO, ArO, and Related Molecules," Journal of the American Chemical Society 101(11):2804-2814, May 23, 1979.

Zhang, H. et al., "Time dependent surface enhanced Raman spectroscopy of pyridine in AgBr sol," Spectrochimica Acta 471A(7):927-932, 1991.

Zhang, H. et al., "A Study of Relationship Between Universality in Fractal Colloids Aggregation and Time-dependent SERS," Science in China (Series B), vol. 37(4):395-401, Apr. 1994.

Zhang, H. et al., "Time dependent UV-absorption spectra and surface enhanced Raman scattering of pyridine in AgCl sol," Spectrochimica Acta Part A, vol. 51, pp. 1903-1908, 1995.

\* cited by examiner

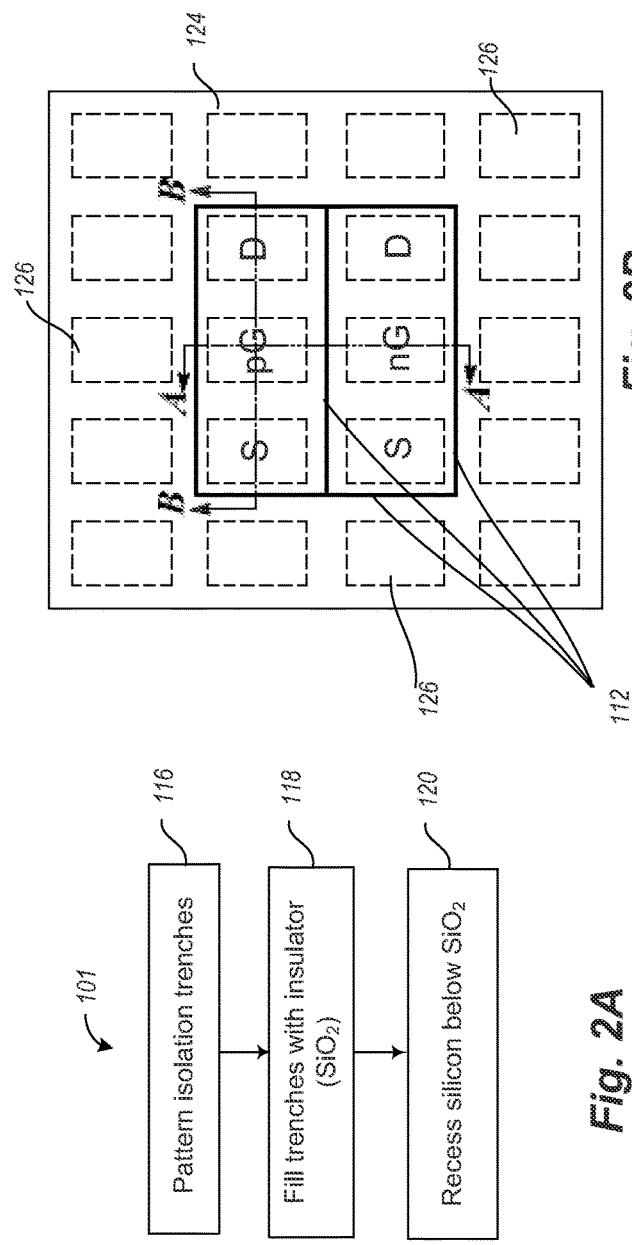
Fig. 2A
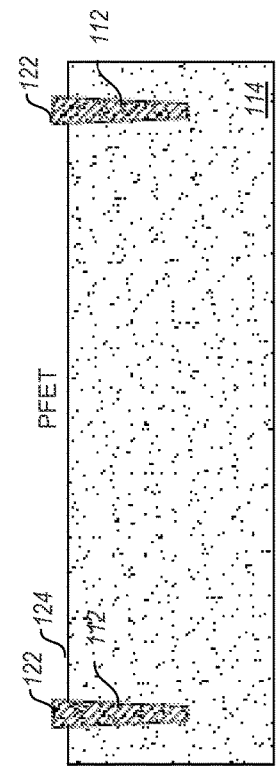
Fig. 2B
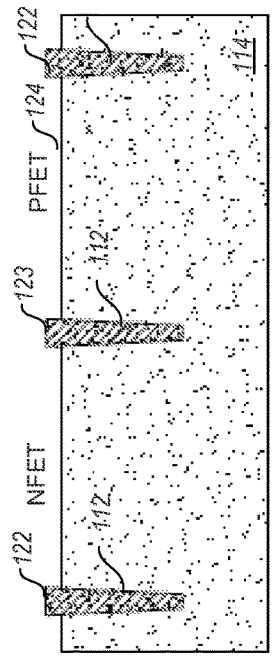
Fig. 2C
Fig. 2D

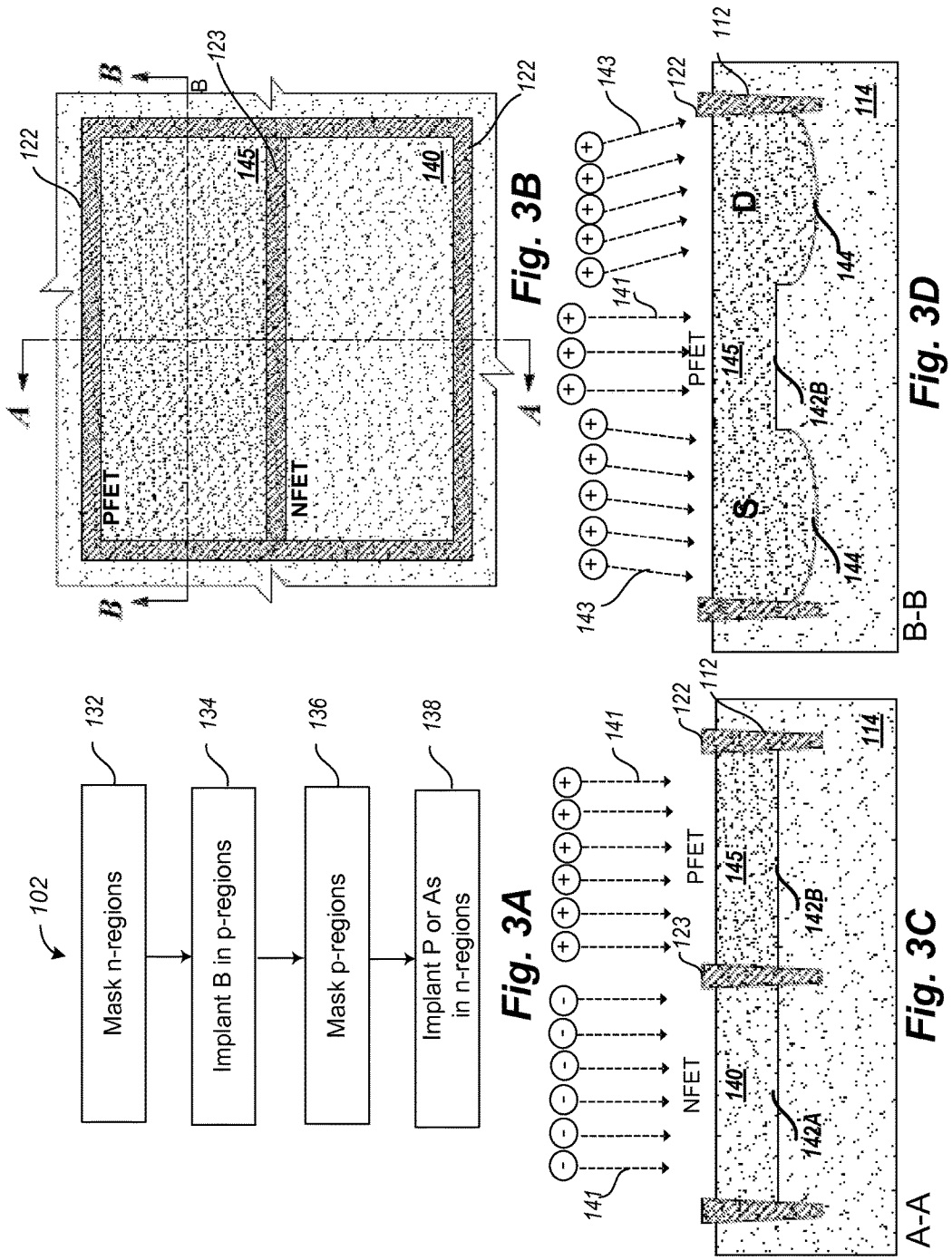

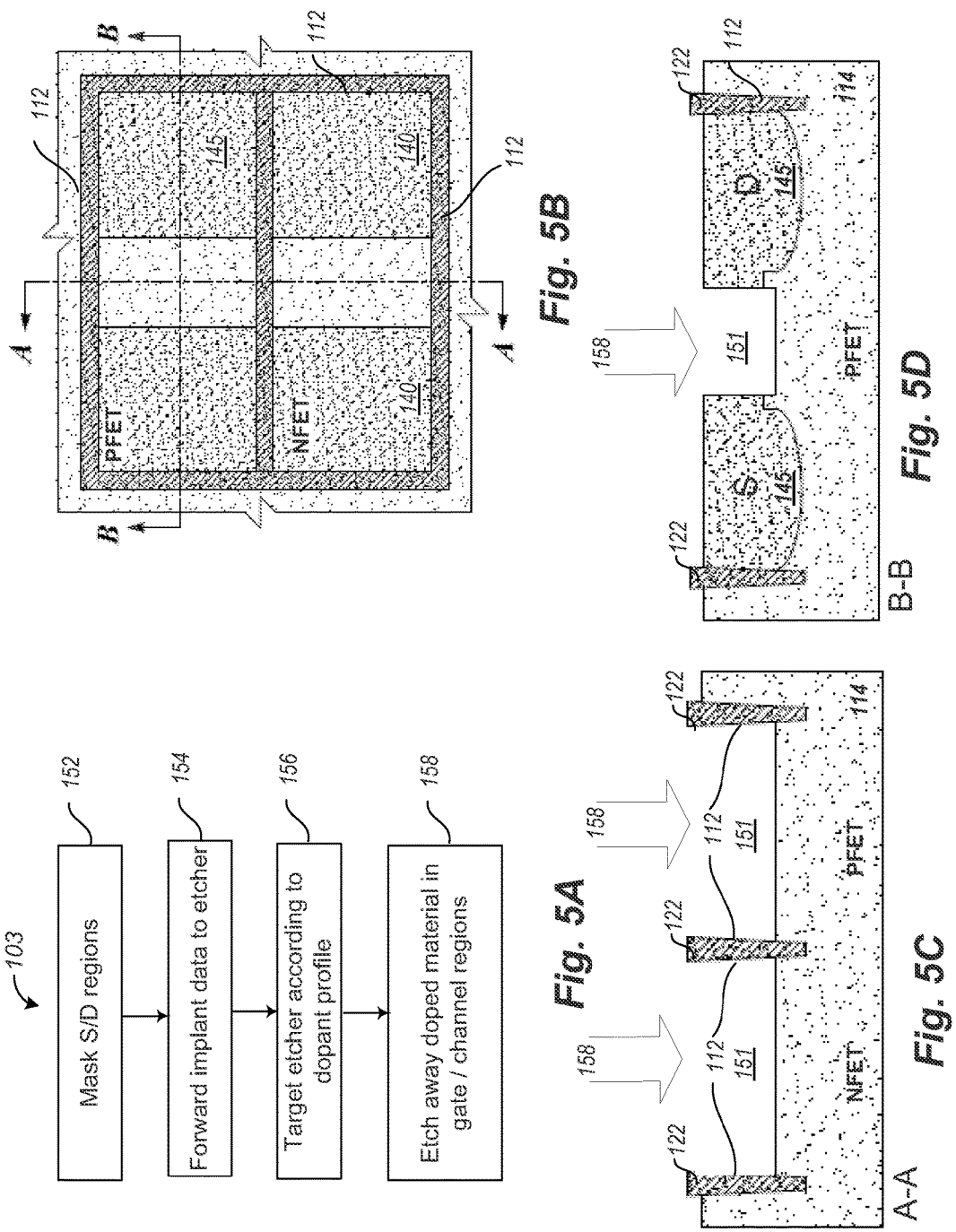

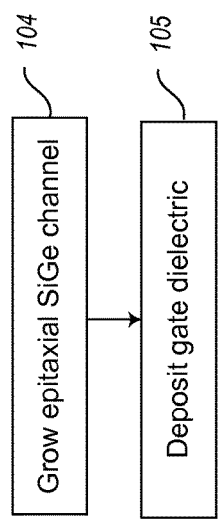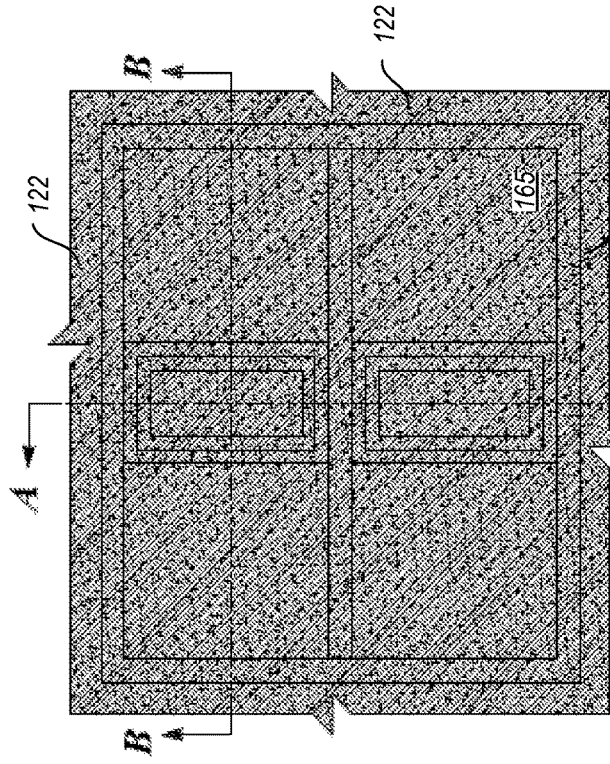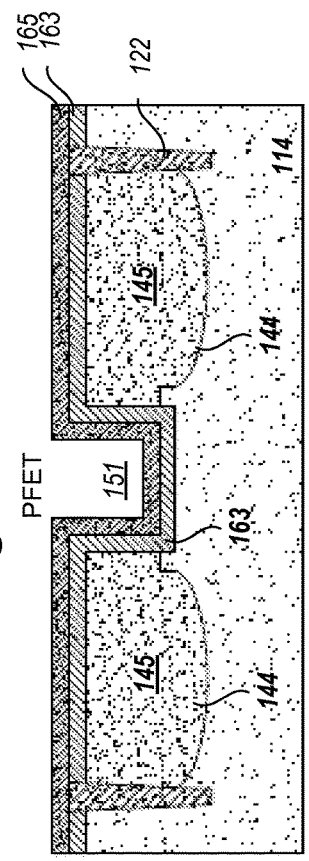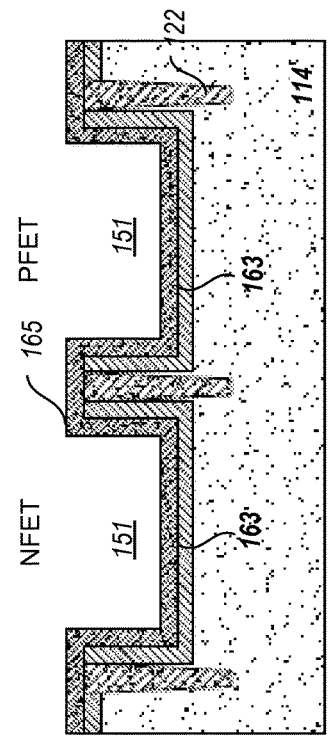

TRANSISTORS INCORPORATING METAL QUANTUM DOTS INTO DOPED SOURCE AND DRAIN REGIONS

RELATED APPLICATION

This patent application claims benefit under 35 U.S.C. §119(e) of U.S. Provisional Patent Application No. 61/705,608, filed on Sep. 25, 2012, which is hereby incorporated by reference in its entirety.

BACKGROUND

Technical Field

The present disclosure relates to the fabrication of nanometer-sized integrated circuit field effect transistor (FET) devices and, in particular, to devices that incorporate quantum dot films to control electrical characteristics of the devices.

Description of the Related Art

As technology nodes for integrated circuits scale below 10 nm, maintaining precise control of various electrical characteristics in bulk semiconductor devices becomes increasingly more challenging. Bulk semiconductor devices include, for example, metal-oxide-semiconductor field effect transistors (MOSFETs). A MOSFET is a three-terminal switching device that includes a source, a gate, and a drain. MOSFETs are interconnected by a network of wires through contacts to each of the source, drain, and gate terminals.

When a voltage exceeding a certain threshold voltage ($V_t$) is applied to the MOSFET gate, the device switches on so that an electric current flows through a channel between the source and the drain. The value of $V_t$ depends, in part, on the characteristic energy band structure of the semiconductor material and, in particular, on a characteristic band gap which represents the amount of energy needed to boost a valence electron into the conduction band, where the electron can participate as a charge carrier in the channel current. The source and drain regions are typically doped with ions that serve as charge reservoirs for the device. Device performance parameters such as switching speed and on-resistance are largely dependent upon control of doping concentrations and the locations (e.g., depth profiles) of the dopants in the substrate after implantation and/or after annealing implanted regions at high temperatures.

Present technology challenges include, for example, achieving desirable dopant concentrations in the source and drain (S/D) regions, maintaining low S/D contact resistance, preventing short channel effects (SCE), improving drain-induced barrier lowering (DIBL), controlling $V_t$, and controlling a characteristic sub-threshold slope (SS). Strained silicon transistors address some of these challenges by replacing bulk silicon in the source and drain regions with epitaxially-grown silicon compounds. Strained silicon presents one alternative to ion doping, and therefore circumvents problems associated with controlling dopant concentrations and profiles. Introducing strain into the silicon crystal of a MOSFET tends to increase charge mobility in the channel region, thereby improving performance. However, strained silicon and other new technologies fail to address all of the technology challenges listed above.

BRIEF SUMMARY

Quantum dots are materials (e.g., semiconductors, metals) whose electronic characteristics are closely related to their crystal structure. Quantum dot structures have intermediate electronic properties that differ from both bulk materials and discrete molecules, and these electronic properties can be tuned by varying the size and spacing of the quantum dot crystals. Thus, quantum dots allow more precise control over conductive properties of the crystalline materials by altering the fundamental crystalline structure. Changes in the crystalline structure in turn influence the energy band structure and, specifically, the energy band gap of the semiconductor crystal. The embodiments discussed herein incorporate metallic quantum dots into the source and drain regions of a MOSFET to assist in controlling the transistor performance. In a first embodiment, metal quantum dots are incorporated into ion-doped source and drain regions; in a second embodiment, metal quantum dots are incorporated into in-situ-doped epitaxial source and drain regions.

In particular, according to one embodiment, one quantum dot of a different material from the source/drain material is placed into each of the source and the drain of a transistor. In one preferred embodiment, the source is composed of epitaxially grown semiconductor material, such as silicon or germanium, doped to a selected concentration level. A quantum dot composed of a different type of material, for example a metal, and therefore having a different crystalline structure, is embedded in the semiconductor source and/or drain region. In one embodiment, a single metal quantum dot is incorporated into each respective source and drain of a transistor. The size, shape, location, and area taken up by the added metal quantum dot will alter the operational characteristics of the transistor and provide improved performance of certain parameters. The respective properties of the metal quantum dot, as well as its location and interface with the source or drain region, can be selected to achieve the desired modification of the transistor characteristics.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

FIG. 2A is a process flow diagram showing a detailed sequence of processing steps that can be used to form isolation regions in a silicon substrate, according to one embodiment described herein.

FIG. 2B is a top plan view of a layout for an array of quantum dot PFET and NFET devices after carrying out the processing steps shown in FIG. 2A.

FIG. 2C is a cross-sectional view of the NFET and PFET gates shown in FIG. 2B, taken along the cut lines A-A.

FIG. 2D is a cross-sectional view of the PFET device shown in FIG. 2B, taken along cut lines B-B.

FIG. 3A is a process flow diagram showing a detailed sequence of processing steps that can be used to form n-doped and p-doped carrier reservoirs in the source and drain regions of the NFET and PFET devices via ion implantation.

FIG. 3B is a top plan view of PFET and NFET devices after carrying out the processing steps shown in FIG. 3A.

FIG. 3C is a cross-sectional view of the NFET and PFET gates shown in FIG. 3B, taken along the cut lines A-A.

FIG. 3D is a cross-sectional view of the PFET device shown in FIG. 3B, taken along cut lines B-B.

FIG. 5A is a process flow diagram showing a detailed sequence of processing steps that can be used to remove doped silicon from the substrate to form recessed gate regions of the NFET and PFET devices, according to one embodiment.

FIG. 5B is a top plan view of a layout for an array of quantum dot PFET and NFET devices after carrying out the processing steps shown in FIG. 5A.

FIG. 5C is a cross-sectional view of the NFET and PFET gates shown in FIG. 5B, taken along the cut lines A-A.

FIG. 5D is a cross-sectional view of the PFET device shown in FIG. 5B, taken along cut lines B-B.

FIG. 6A is a process flow diagram showing a detailed sequence of processing steps that can be used to form epitaxial channels according to one embodiment.

FIG. 6B is a top plan view of a layout for an array of quantum dot PFET and NFET devices after carrying out the processing steps shown in FIG. 6A.

FIG. 6C is a cross-sectional view of the NFET and PFET gates shown in FIG. 6B, taken along the cut lines A-A.

FIG. 6D is a cross-sectional view of the PFET device shown in FIG. 6B, taken along cut lines B-B.

DETAILED DESCRIPTION

Figure 1:
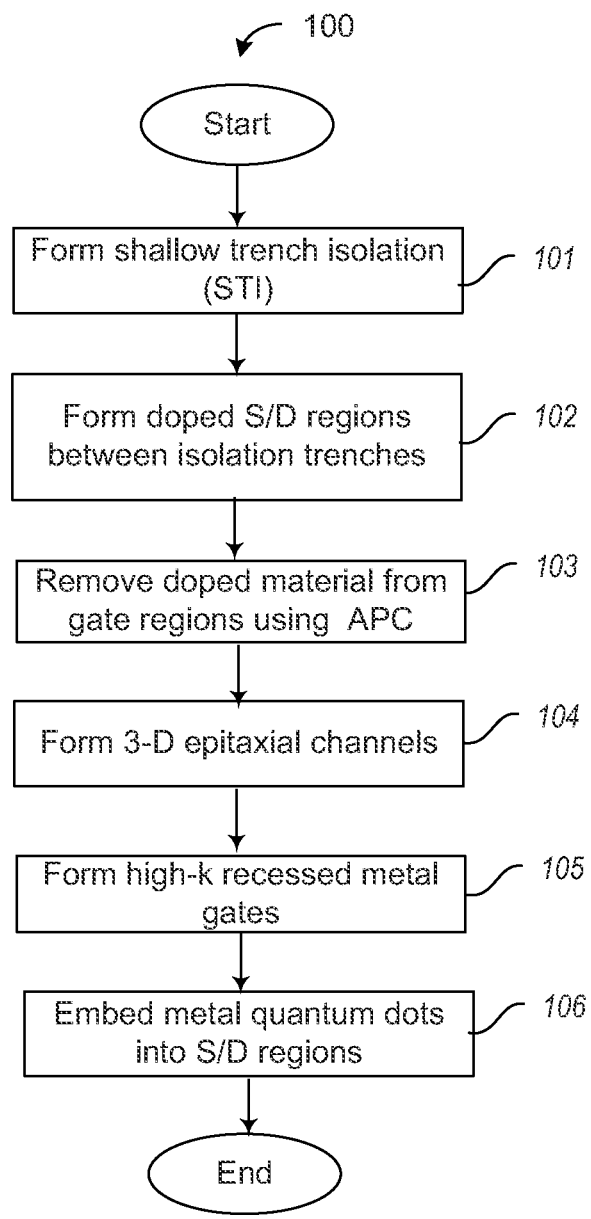
FIG. 1 is a high-level flow diagram summarizing a processing sequence for fabricating MOSFET devices that incorporate metal quantum dot sources and drains, according to two alternative embodiments.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the terms "layer" is used in its broadest sense to include a thin film, a cap, or the like. The term "layout" refers to a drawn pattern seen from a top plan view that implements an integrated circuit design. The layout specifies geometries and spacings of materials formed at each layer of the integrated circuit. Geometries and spacings for each layout are calculated according to a desired operational circuit specification.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber. The term "epitaxy" refers to a controlled process of crystal growth in which a new layer of a crystal is grown from the surface of a bulk crystal, while maintaining the same crystal structure as the underlying bulk crystal. The new layer is then referred to as an "epitaxially-grown" or "epitaxial" layer. Impurities can be incorporated into an epitaxial film, in-situ, as the crystal structure is formed, without imparting damage to the crystal structure.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask, which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to examples of quantum dots, transistor devices, and transistor layouts that have been produced; however, the present disclosure and the reference to certain materials, dimensions, and the details and ordering of processing steps are exemplary and should not be limited to those shown.

In the figures, identical reference numbers identify similar features or elements. The sizes and relative positions of the features in the figures are not necessarily drawn to scale.

FIG. 1 shows a high-level sequence of processing steps in a method 100 that can be used to create a metal quantum dot array device, according to a first embodiment. The device described herein incorporates metal quantum dots into the source and drain regions of a MOSFET transistor.

At 102, charge reservoirs in the source and drain regions are formed by doping areas of a silicon substrate between a pair of isolation trenches formed at 101. A first method of doping uses conventional ion implantation. A second method of doping is performed in-situ during epitaxial growth.

At 103, doped silicon is selectively removed from the gate region while remaining in the source and drain regions.

At 104, an epitaxial channel is formed between the source and drain regions.

At 105, a high-k gate is formed that includes a gate dielectric made of a material that has a high dielectric constant e.g., hafnium oxide ($HfO_2$) or aluminum oxide ($Al_2O_3$), and a metal gate electrode.

At 106, metal quantum dots are embedded into the source and drain regions to adjust the energy band structure of the source and drain junctions, to improve device performance.

FIGS. 2A-7D show and describe in further detail steps in the method 100. In each set of FIGS. A-D, A is a detailed flow diagram; B is a top plan view showing the transistor layout at the current layer; C is a cross sectional schematic view at a cut line A-A through the gate regions of both a negative channel (NFET) device and a positive channel (PFET) device; and D is a cross-sectional view at a cut line B-B through the source, drain, and gate of a PFET transistor, in particular. In accordance with convention, arrows on each cut line represent the direction of an observer's eye looking at the corresponding cut plane. The cross-sectional views C,D correspond to the area within the solid rectangles shown in the plan view B.

FIG. 2A shows the initial process step 101 in more detail, as a sequence of steps that can be used to form and fill isolation trenches 112 in a silicon substrate 114, according to one embodiment.

At 116, the isolation trenches 112 are patterned in the silicon substrate 114 using conventional lithography and reactive ion etching (RIE) techniques known to those skilled in the art of semiconductor fabrication.

At 118, the isolation trenches 112 are filled with an insulating material, typically a type of silicon dioxide ($SiO_2$), forming isolation regions, sometimes called shallow trench isolation 122 (STI), though the aspect ratio (depth:width) of the trenches may not be consistent with the term "shallow." For example, in one embodiment as described herein, the depth of the STI is within the range of about 10-200 nm. The STI fill operation can be carried out according to known plasma deposition techniques. The outer STI regions 122 electrically insulate the NFET and PFET devices from neighboring devices (FIGS. 2C, 2D) and a central STI region 123 insulates the NFET and PFET devices from one another (FIG. 2C).

At 120, a silicon surface 124 of the silicon substrate 114 is recessed slightly below the upper surface of the STI 122.

FIG. 2B shows a top plan view that corresponds to the two cross sections, FIGS. 2C, 2D, as described above. The thick solid lines shown in FIG. 2B are approximately aligned with the isolation trenches 112 that delineate the boundaries of the NFET and PFET devices, both physically and electrically. The future locations of each transistor are foreshadowed by three rectangular fields shown as dotted rectangles in FIG. 2B. For example, the NFET will be the lower transistor (S-nG-D), in which the gate of the future NFET device is marked "nG". Likewise, the PFET device will be the upper transistor (S-pG-D, along the cut lines B-B), in which the gate of the future PFET device is marked "pG". Other rectangular fields 126, shown in FIG. 2B also shown as dotted lines, are associated with neighboring transistors.

FIG. 3A shows the process step 102 in further detail, as a sequence of steps that can be used to dope source and drain regions of the NFET and PFET devices by ion implantation, as indicated in FIGS. 3B, 3C, and 3D according to a first embodiment.

At 132, regions 140 of the substrate 114 that are to be implanted with negative ions are masked, preferably using a silicon nitride hard mask.

At 134, a first ion implantation is carried out to introduce positive dopants (e.g., boron) into the substrate 114. Implantation in a downward direction 141, substantially normal to the surface of the substrate 114, is desirable to achieve a horizontal p-doping profile 142B. Implantation in a slightly diagonal direction 143, at a small angle to a surface normal, is desirable to optimize curved p-doping profiles 144. The desired concentration of positive dopants in p-doped carrier reservoirs 145 is within the range of about 1.0 E19-1.0 E21 atoms/cm$^3$, with a target concentration of about 2.0 E20 atoms/cm$^3$.

At 136, the hard mask is removed from n-doped regions 140, and p-doped carrier reservoirs 145 are masked.

At 138, a second ion implantation is carried out to introduce negative dopants (e.g., phosphorous, arsenic) into the substrate 114. Implantation in the downward direction 141 substantially normal to the surface of the substrate 114 is desirable to achieve a horizontal n-doping profile 142A. The desired concentration of negative dopants in the n-doped regions 140 is within the range of about 1.0 E19-1.0 E21 atoms/cm$^3$, with a target of about 2.0 E20 atoms/cm$^3$.

The ion implantation process shown and described in FIGS. 3A-3D is sometimes preferred for minimum dimensions (i.e., gate lengths) below 20 nm. At such small geometries, damage caused by ion implantation may result in severe degradation of the silicon crystalline structure in the source and drain regions. Sometimes the degradation is so great that it cannot be healed sufficiently by a later annealing process. In such cases, an alternative doping method can be substituted for ion implantation. One such alternative, source and drain doping during in-situ epitaxial growth, is presented as a second embodiment of the process step 102, shown and described in detail in FIGS. 4A-4D.

Figure 4B:
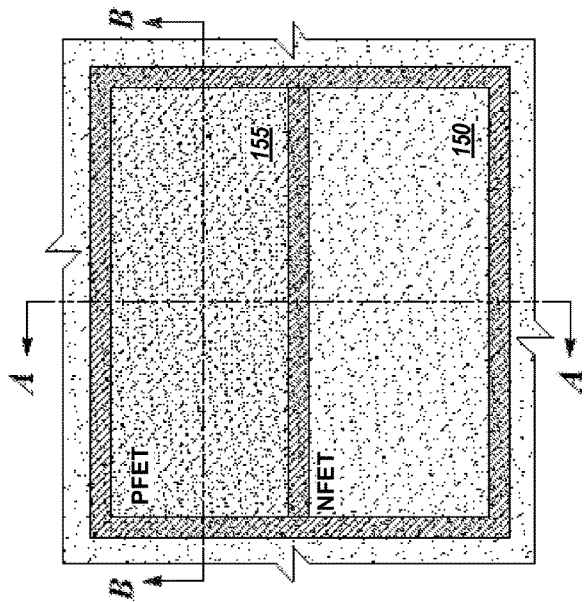
FIG. 4B is a top plan view of a layout for an array of quantum dot PFET and NFET devices after carrying out the processing steps shown in FIG. 4A.
Figure 4D:
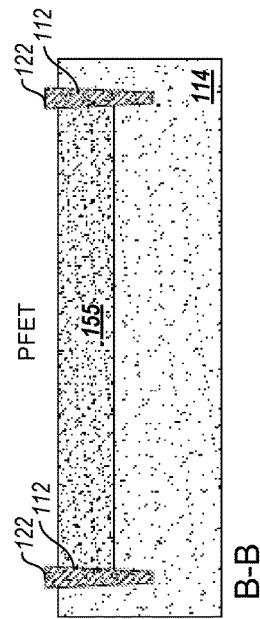
FIG. 4D is a cross-sectional view of the PFET device shown in FIG. 4B, taken along cut lines B-B.
Figure 4A:
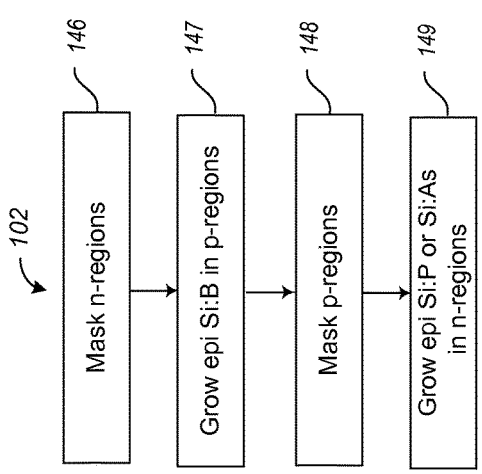
FIG. 4A is a process flow diagram showing a detailed sequence of processing steps that can be used to form n-doped and p-doped carrier reservoirs in the source and drain regions of the NFET and PFET devices via in-situ epitaxial growth.

FIG. 4A shows a sequence of process steps that can be used to form an epitaxial n-doped carrier reservoir 150 and epitaxial p-doped carrier reservoirs 155.

At 146, regions of the silicon substrate 114 that are to be epitaxially doped in situ with negative ions (carrier reservoirs 150) are masked, preferably using a silicon nitride hard mask. There are least two different techniques by which the epitaxially formed source and drain regions can be grown. According to a first technique, a mask is aligned with the region that will become the p-region of the silicon substrate. The silicon substrate is then etched away to remove the substrate material between the shallow trench isolation regions at the edges of the mask opening. This will leave the isolation trenches 112 in the substrate and adjacent to the regions which are covered by the mask. After this, the epitaxial material is grown to fill the recess which has been etched away, to form a new region which is doped in-situ during the process of epitaxial growth. The epitaxial layer completely fills the region between the isolation trenches 112. This ensures that the epitaxial region will be self-aligned with the shallow trench isolation regions, since they form the boundary by which the epitaxial growth takes place.

At 147, a first epitaxial growth process is carried out that incorporates positive dopants e.g., epitaxial silicon-boron (epi Si:B) into the silicon substrate 114. The epitaxial doping process results in the p-doped carrier reservoir 155 (FIGS. 4C, 4D) that is recognizable by its uniform, horizontal doping profile. The p-doped carrier reservoir 155 is therefore noticeably distinct from the curved p-doping profiles 144 that result from the small angle ion implantation process described shown above in FIG. 3D. The concentration of positive dopants in the epitaxial p-doped carrier reservoirs 155 is about 2.0 E21 atoms/cm$^3$ for epi Si:B.

At 148, the hard mask is removed from the n-doped carrier reservoirs 150, and the epitaxial p-doped carrier reservoirs 155 are masked.

Figure 4C:
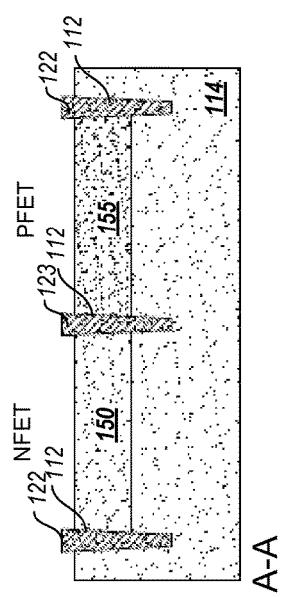
FIG. 4C is a cross-sectional view of the NFET and PFET gates shown in FIG. 4B, taken along the cut lines A-A.

At 149, a second epitaxial growth process is carried out to incorporate negative dopants (e.g., epitaxial silicon-phosphorous (epi Si:P), or epitaxial silicon-arsenic (epi Si:As)) into the substrate 114. The epitaxial doping process results in the n-doped carrier reservoir 150 (FIG. 4C). The concentration of negative dopants in the n-doped carrier reservoir 150 is about 1.0 E21 atoms/cm$^3$ for epi Si:As, and about 5.0 E20 atoms/cm$^3$ for epi Si:P.

According to a second technique, epitaxial growth of the carrier reservoirs 150 and 155 can occur prior to formation of the isolation trenches 112. A portion of the substrate 114 is masked to prevent growth of the epitaxial layer, while epitaxial growth takes place in those areas which are unmasked. This type of epitaxial growth is a purely additive technique in which the epitaxially grown crystalline structure is added to the current substrate, after which isolation trenches 112 are etched through the epitaxial layer and filled.

Either of the two techniques may be used to create the separate epitaxially doped charge reservoirs as shown in FIGS. 4C and 4D, although the second technique is generally preferred. Other techniques may also be used to form the epitaxially grown source and drain regions.

FIG. 5A shows the process step 103 in further detail, as a sequence of steps that can be used to create recessed gate areas 151 shown in FIGS. 5B, 5C, and 5D, according to one embodiment. The recessed gate areas 151 will accommodate the epitaxial channels and recessed metal gates formed in subsequent processing steps. The recessed gate areas 151 can be formed by etching away portions of the n-doped and p-doped carrier reservoirs 140 and 145, respectively, using an RIE process that is carried out in a plasma etcher.

At 152, the source and drain areas are masked so as to recess only the areas where the epitaxial channels and the transistor gates will be formed.

At 154, dopant profile data collected during the ion implantation processing steps 134 and 138 is forwarded to a controller that controls the plasma etcher, in a scheme referred to as advanced process control (APC).

At 156, using APC, a customized target depth is set for the etching process on a lot-by-lot basis, wherein the target depth is based on the ion implantation data. In this way, etch profiles of the recessed gate areas 151 can be adjusted to match the horizontal dopant profiles 142A,B. To prevent short channel effects, it is desirable that the recessed gate areas 151 extend laterally in both directions to fully intersect the isolation trenches 112. Otherwise, residual dopants intended for only source and drain carrier reservoirs 140 and 145 will remain present underneath the gate in the channel region, effectively narrowing, or shortening, the channel.

At 158, the recess RIE process removes doped material from the gate regions (both n and p) creating the recessed gate areas 151. In one embodiment, the depth of the recessed gate areas 151 is within the range of about 10-100 nm, with a target of 60 nm. Alternatively, depending on the materials used, it may be possible to determine an etch chemistry that etches the doped material (both n- and p-type) preferentially, without removing the silicon substrate 114 and the STI 122.

It is noted that the process sequence described above (102, 103; FIGS. 2A-4D) for formation of recessed gate MOSFET transistors is executed in the opposite order from a conventional MOSFET fabrication process. In a conventional MOSFET fabrication process, a gate is formed first, above the surface of the substrate 114, for use as a mask during implantation of the source and drain regions. Whereas, according to the present scheme, the source and drain regions are formed first, and the source and drain profiles can then be used to guide formation of a recessed gate structure. Such a process sequence was first described in U.S. Patent Application Publication 2012/0313144 to Zhang et al., entitled "Recessed Gate Field Effect Transistor," published on Dec. 13, 2012.

FIGS. 6A-6D show and describe process steps 104 and 105 in further detail. Process steps 104 and 105 can be used to form non-planar epitaxial channels in the recessed gate areas 151, according to one embodiment.

At 104, epitaxial channels 163 are formed by growing an epitaxial layer that covers both the NFET and PFET devices, for example, an epitaxial silicon germanium (SiGe) layer or an epitaxial germanium (Ge) layer. The epitaxial channels 163 are formed below the region where the transistor gates will be formed, lining the recessed gate areas 151, so as to surround the gate on three sides as shown in FIGS. 6C, 6D. The epitaxial channels 163 are desirably about 5-50 nm thick.

At 105, a high-k gate dielectric 165 is formed on top of the non-planar epitaxial channel 163, again covering both the NFET and PFET devices. The dielectric constant of the high-k gate dielectric 165 is desirably greater than about 4.0 and the thickness of the high-k gate dielectric 165 is desirably within the range of about 2-20 nm.

Figure 7B:
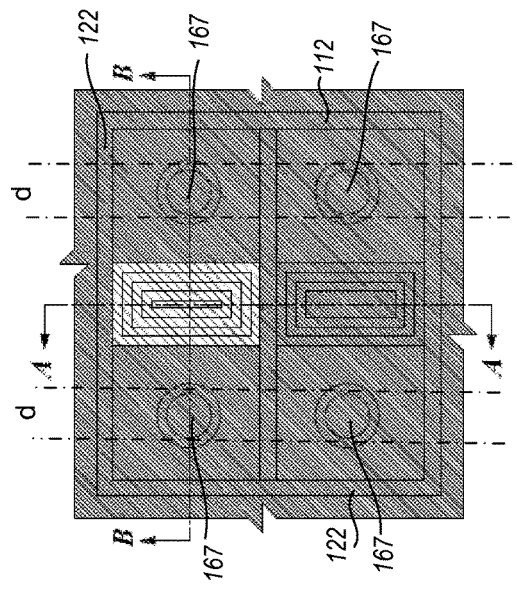
FIG. 7B is a top plan view of a layout for an array of quantum dot PFET and NFET devices after carrying out the processing steps shown in FIG. 7A.
Figure 7A:
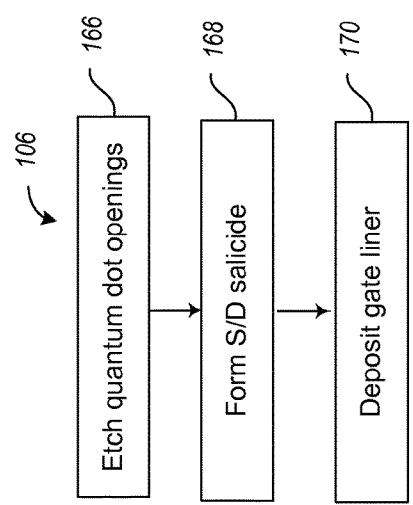
FIG. 7A is a process flow diagram showing a detailed sequence of processing steps that can be used to form metal silicides that reduce contact resistance, according to one embodiment.

FIG. 7A shows the process step 105 in further detail, as a sequence of steps that can be used to form a metal gate electrode, and to form a metal silicide on the p-doped source and drain carrier reservoirs 145, according to one embodiment.

Figure 7D:
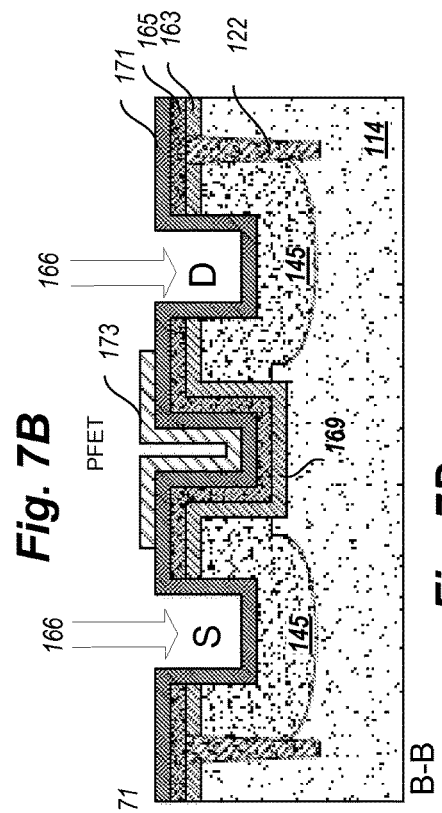
FIG. 7D is a cross-sectional view of the PFET device shown in FIG. 7B, taken along cut lines B-B.
Figure 7C:
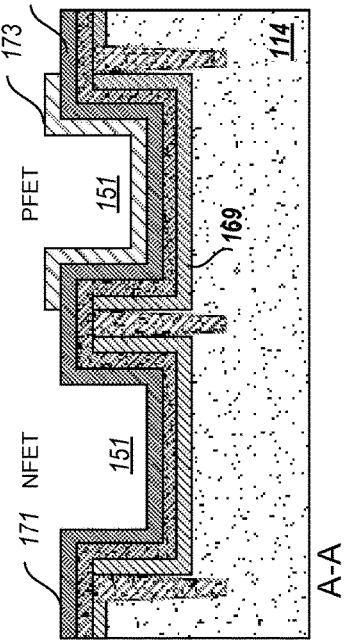
FIG. 7C is a cross-sectional view of the NFET and PFET gates shown in FIG. 7B, taken along the cut lines A-A.

At 166, quantum dot openings 167 are etched through sections of the high-k gate dielectric 165 and the epitaxial channel 163, and into the doped source and drain carrier reservoirs 145 (FIG. 7D). The quantum dot openings 167 desirably have a diameter, d, within the range of about 10-100 nm (FIG. 7B). The dots are referred to as "quantum dots" because of their small dimensions. In one embodiment, the maximum dimension of the dot will be in the range of 10 nm to 12 nm, while along some directions it may have dimension in the range of less than 5 nm. Thus, the size of the quantum dot is approaching dimensions in the range of 50 Å to 100 Å, in which the atomic effects of the individual atoms and their arrangement in a crystalline structure may have specific effects. The RIE etch depth target can be set, again, using APC, according to a measured step height associated with the recessed gate area 151. The etch depth target is desirably set to a value that results in a depth of the quantum dot openings 167 that is shallower than a corresponding depth 169 of the gate region (FIGS. 7C, 7D).

At 168, a self-aligned metal silicide 171 ("salicide") is formed in the source and drain carrier reservoirs 145. A metal is conformally deposited onto the surface, for example, using a PVD process. The metal comes into contact with the doped silicon in the quantum dot openings and reacts chemically with the doped silicon to form a metal silicide compound. Metal on the surface of the recessed gate areas 151 does not form a metal silicide. The metal silicide 171 reduces contact resistance associated with the metal quantum dots, and thus the electrical properties of the metal silicide 171 directly influence device performance. Properties of the metal silicide 171 determine, in large part, a height of a Schottky barrier at the source/drain boundary associated with contact resistance. Properties of the metal silicide 171 are influenced by the type of metal deposited, the type of dopants used, and the doping concentration, and the overall film quality. Dual metal silicides 171 can be formed by depositing the same metal (e.g., titanium or titanium nitride) onto both the n-doped and p-doped regions using two successive masking operations (e.g., using oxide hard masks). Thickness of the metal silicide 171 is desirably in the range of about 1-20 nm, with a film thickness target of 10-20 nm.

At 170, a thin metal gate liner 173, in the range of about 1-10 nm thick, but desirably less than about 8 nm thick, is formed in the recessed gate areas 151 of both of the NFET and PFET devices. In one embodiment, the NFET gate liner includes titanium (Ti) and/or titanium nitride (TiN) or titanium carbide (TiC) for a gate electrode made of tungsten (W). The gate liner 173 can be a multi-layer stack that includes, for example, 1 nm TiN on 5 nm TiC, on 1 nm TiN. In another embodiment, the gate liner 173 includes tantalum (Ta) and/or tantalum nitride (TaN) for a gate electrode made of copper (Cu). The gate liner 173 for PFET devices is desirably made of 1-10 nm TiN targeted at 4 nm. The gate liner 173 for PFET devices can be formed by first depositing the multi-layer stack on both the NFET and PFET devices, masking the NFET devices, etching away the top two layers (e.g., TiN and TiC), and depositing additional TiN.

Figure 8B:
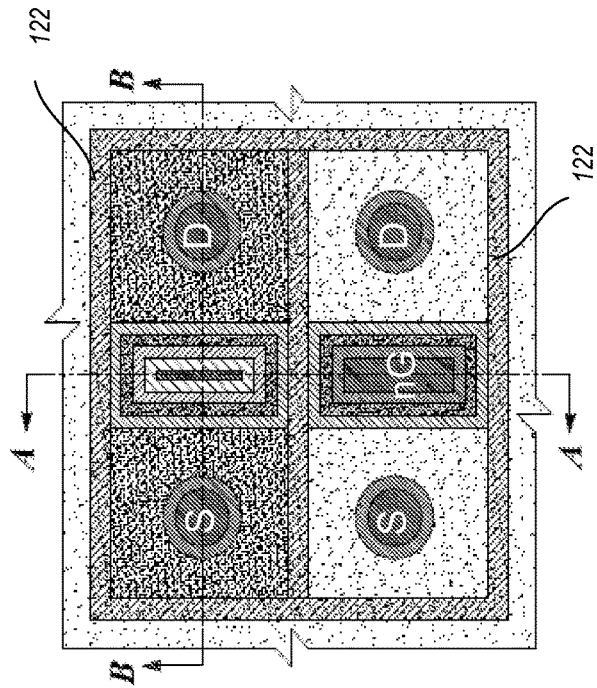
FIG. 8B is a top plan view of a layout for an array of quantum dot PFET and NFET devices after completing processing steps shown in FIG. 1, according to a first embodiment.
Figure 8D:
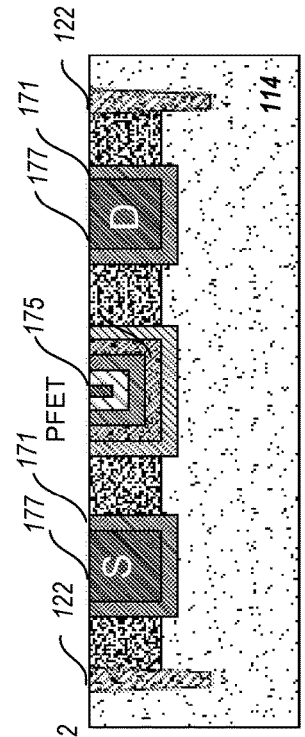
FIG. 8D is a cross-sectional view of the PFET device shown in FIG. 8B, taken along cut lines B-B.
Figure 8A:
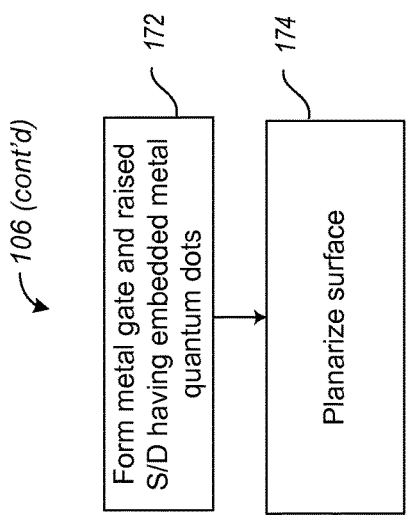
FIG. 8A is a process flow diagram showing a detailed sequence of processing steps that can be used to form metal gate electrodes and metal source and drain quantum dots, according to one embodiment.
Figure 8C:
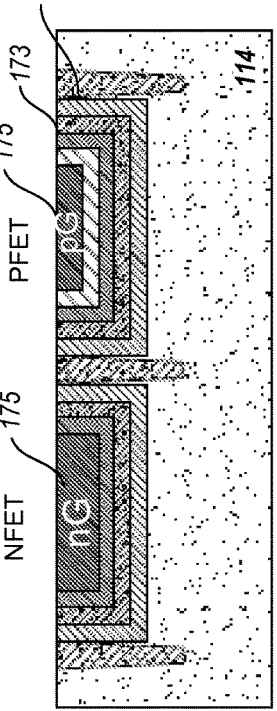
FIG. 8C is a cross-sectional view of the NFET and PFET gates shown in FIG. 8B, taken along the cut lines A-A.

FIG. 8A shows further details of the process step 106, including a processing sequence that can be used to form the metal gate and to embed metal quantum dots into the raised source and drain regions, according to one embodiment. FIGS. 8B, 8C, and 8D show finished, planarized NFET and PFET devices made according to the second embodiment described above that achieves source and drain doping via in-situ epitaxial growth at step 102.

At 172, bulk metal is deposited in the recessed areas 151 to form recessed metal gate electrodes 175 (FIGS. 8C, 8D) and also in the quantum dot openings 167 to form embedded metal quantum dots 177 (FIGS. 8B, 8D) in the source and drain carrier reservoirs 145. Metals suitable for use as metal gate electrodes 175 and metal quantum dots 177 include, for example, tungsten, copper, silver, gold, aluminum, and the like. Thickness of the metal quantum dots 177 is desirably about 60 nm. The metal quantum dots 177 are deposited so as to form a raised source and drain.

The formation of the quantum dot 177 is selected to provide a particular crystalline structure of the metal. As is known, the crystal structure of copper is generally a cube; however, the exact connection of the atoms to each other, as well as the presence of dopants in the material, can modify the crystalline structure and also present different planes of the lattice. The metal, whether copper, aluminum, or the like, which is used will generally have a drastically different crystal structure than the surrounding semiconductor material, and therefore will affect the threshold voltage speed of operation as well as a number of other parameters of the semiconductor. In one preferred embodiment, the quantum dot is composed of tungsten. Another acceptable metal is aluminum. In the event copper or gold are used for the metal in the quantum dot, care will be taken to provide the appropriate liners, such as a tantalum or molybdenum liner for copper, in order to block diffusion of the copper into the silicon lattice and thus harm its operational characteristics. Accordingly, the metal silicide 171 is selected both to affect the device performance and also to provide the appropriate barrier between the type of metal which is placed into the semiconductor substrate to avoid contamination.

Figure 9A:
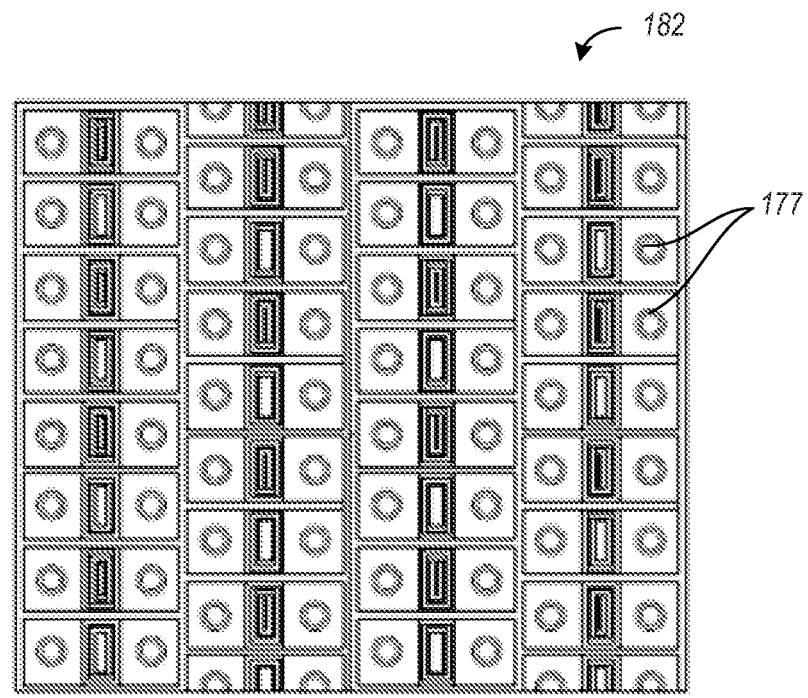
FIG. 9A is a top plan view of a layout of a densely-packed offset array of MOSFETs containing quantum dot sources and drains.

The location, as well as the shape and size of the quantum dots, provides significant ability to precisely control the transistor performance. While just a single dot is shown in each of the respective source and drains for a single transistor, in some embodiments two or more dots may be provided, spaced apart from each other, as shown in FIG. 9A. As is also clear in the following description the quantum dots can have a shape which is also selected to affect transistor performance as discussed in more detail with respect to FIG. 9B.

Another factor which affects device performance is the distance between the gate and the quantum dot. The distance is preferably selected to maintain a sufficient threshold that the transistor does not turn on prematurely due to noise characteristics. Also, the spacing is selected to provide a clear transition from on to off for the transistor. If the quantum dot is too close to the gate, there is some potential for increased interaction between the metal in the quantum dot 177 and the metal charge on the gate electrode during operation. Accordingly, the quantum dot does not physically abut against the gate electrode, but is spaced some small distance away, preferably greater than 5 nm away and less than 100 nm away, so as to provide appropriate spacing and some semiconductor material between the quantum dot and the metal gate.

At 174, the surface of the completed transistor devices is polished using a metal CMP process that stops on the silicon substrate 114 (FIGS. 8C, 8D).

Figure 9B:
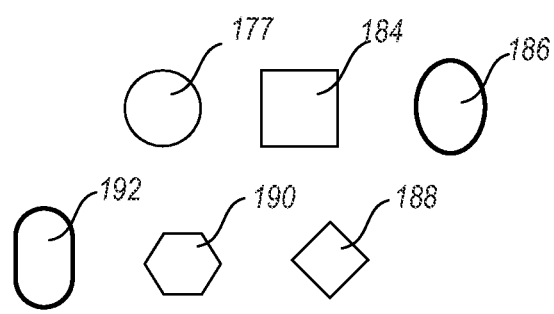
FIG. 9B shows alternative shapes of quantum dots for use in integrated circuit layouts.

FIGS. 9A and 9B show top plan views of alternative quantum dot array designs. One alternative to a square array layout shown above in each of the preceding plan views is an offset array 182 of quantum dot devices shown in FIG. 9A. The offset array 182 packs the quantum dot devices into a higher density matrix. FIG. 9B shows alternative geometries for the circular quantum dots 177 patterned in FIG. 9A, including polygons such as square quantum dots 184, diamond quantum dots 188, and hexagonal quantum dots 190. Alternatively, elongated quantum dots can be used such as elliptical quantum dots 186 and oblong quantum dots 192. Such alternative quantum dot shapes may be advantageous with respect to design, layout, processing, or performance of MOSFET devices that incorporate quantum dots.

In a preferred embodiment, the quantum dots are in the shape of a column 192, also referred to as the oblong quantum dot 192. The use of a column quantum dot 192 has a number of particular advantages with respect to transistor operation. The length of the column 192 will be selected to be approximately equal to the channel width. (As is known in semiconductor terminology, the channel length is the distance between the source and the drain, and the channel width is perpendicular to this, the sideways extension of the channel.) By having a column shape 192 for the quantum dot, the effect of the quantum dot will be uniform across the entire channel, and therefore the electrical conduction properties that are affected by the quantum dot will be substantially uniform across the entire channel dimensions. Accordingly, when a column shape 192 is selected for the quantum dot, the quantum dot will be relatively thin, for example less than about 10 nm, and the length of the quantum dot will be approximately equal to the channel width. A diamond shape 188 or square shape 184 for the quantum dot also has a particular effect on the electrical characteristics. As will be appreciated, electrical charge often accumulates at point locations. The use of a diamond shape 188 will affect electrical charge buildup at the points of the diamond, which will have an effect on the conduction locations through the channel. Similarly, a hexagon or octagon shape 190 provides additional points, and the orientation of the hexagon or octagon 190 with respect to the channel can be selected to produce the desired electrical properties.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A transistor, comprising:
   a substrate;
   an isolation region formed in the substrate;
   a fully recessed metal gate formed in the substrate within the isolation region, the fully recessed metal gate including a gate dielectric and a metal gate electrode;
   a metal source region being a first carrier reservoir on a first side of the fully recessed metal gate, the metal source region having a contact including a first metal quantum dot;
   a metal drain region being a second carrier reservoir on a second side of the fully recessed metal gate, the second side opposite the first side, the metal drain region having a contact including a second metal quantum dot; and
   a channel region in contact with the fully recessed metal gate and extending between the first and second carrier reservoirs.

2. The transistor of claim 1, wherein when the transistor is an NFET, the first and second carrier reservoirs include silicon regions doped with phosphorous or silicon phosphide, and when the transistor is a PFET, the first and second carrier reservoirs include silicon regions doped with boron or boron silicon germanium.

3. The transistor of claim 1 wherein, when the transistor is a PFET, the first and second carrier reservoirs are lined with platinum silicide, and when the transistor is an NFET, the first and second carrier reservoirs are lined with nickel silicide, the silicide thicknesses ranging from 1-20 nm.

4. The transistor of claim 1 wherein, when the transistor is a PFET, the first and second carrier reservoirs are lined with platinum silicide, and when the transistor is an NFET, the first and second carrier reservoirs are lined with a rare earth metal silicide, the silicide thicknesses ranging from 1-20 nm.

5. The transistor of claim 4 wherein the rare earth metal silicide includes one or more of yttrium silicide or erbium silicide.

6. The transistor of claim 1 wherein the metal gate electrode is made of tungsten and includes a liner of thickness 1-10 nm made of titanium or titanium nitride.

7. The transistor of claim 1 wherein the metal gate electrode is made of copper and includes a liner of thickness 1-10 nm made of tantalum nitride.

8. The transistor of claim 1 wherein the gate dielectric has a high dielectric constant greater than about 4.0.

9. The transistor of claim 1 wherein the channel region is epitaxial.

10. The transistor of claim 9 wherein the channel region is in contact with at least three sides of the fully recessed metal gate.

11. A transistor array layout, comprising:
    a plurality of transistors having source and drain regions, the source and drain regions being doped silicon carrier reservoirs;
    a first regular surface pattern of metal quantum dots having planar surfaces, the metal quantum dots embedded within the source and drain regions such that all sidewall surfaces of the metal quantum dots are enclosed by the respective doped silicon carrier reservoir; and
    a second regular surface pattern of gate array elements disposed between adjacent ones of the metal quantum dots.

12. The transistor array layout of claim 11 wherein the first and second regular surface patterns have different shapes.

13. The transistor array layout of claim 11 wherein shapes of the metal quantum dots, as seen from a top plan view, include one or more of circles, ellipses, or polygons.

14. The transistor array layout of claim 11 wherein the metal quantum dots are arranged in a periodic lattice structure.

15. A transistor comprising:
a substrate;
an isolation region in the substrate;
a non-planar conducting channel formed in the substrate;
a source region formed in the substrate and in contact with the non-planar conducting channel, the source region including a first doped carrier reservoir that, in operation, injects charge into the non-planar conducting channel;
a drain region formed in the substrate and in contact with the non-planar conducting channel, the drain region including a second doped carrier reservoir that, in operation, injects charge into the non-planar conducting channel;
metal quantum dots embedded as contacts in the source and drain regions such that a top side of the metal quantum dots are coplanar with a top side of the source and drain regions, and all other sides of the metal quantum dots are enclosed by silicon; and
a fully recessed metal gate formed in the substrate.

16. The transistor of claim 15 wherein the non-planar conducting channel is made of an epitaxially grown material.

17. The transistor of claim 15 wherein the fully recessed metal gate contacts at least three sides of the non-planar conducting channel.

18. The transistor of claim 15 wherein the fully recessed metal gate includes a gate dielectric having a dielectric constant greater than about 4.0.

19. The transistor of claim 15 wherein the first and second doped carrier reservoirs each have a doping concentration within the range of about 1.0 E19-1.0 E21 atoms/cm$^3$.

20. The transistor of claim 15 further comprising metal silicides adjacent to the metal quantum dots, the metal silicides incorporating dopants from the first and second doped carrier reservoirs.

* * * * *